(12) United States Patent
Lemoult et al.

(10) Patent No.: US 9,681,548 B2
(45) Date of Patent: Jun. 13, 2017

(54) ELECTRICAL CONNECTING DEVICE

(71) Applicant: JOHNSON CONTROLS AUTOMOTIVE ELECTRONICS SAS, Cergy Pontoise (FR)

(72) Inventors: Jean-Claude Lemoult, Cherre (FR); Jean-Marie Bariller, Sable sur Sarthe (FR)

(73) Assignee: JOHNSON CONTROLS AUTOMOTIVE ELECTRONICS SAS, Cergy Pontoise (FR)

( * ) Notice: Subject to any disclaimer, the term of this patent is extended or adjusted under 35 U.S.C. 154(b) by 0 days.

(21) Appl. No.: 14/908,563

(22) PCT Filed: Jul. 29, 2014

(86) PCT No.: PCT/EP2014/066310
§ 371 (c)(1),
(2) Date: Mar. 31, 2016

(87) PCT Pub. No.: WO2015/014856
PCT Pub. Date: Feb. 5, 2015

(65) Prior Publication Data
US 2016/0212848 A1    Jul. 21, 2016

(30) Foreign Application Priority Data
Jul. 30, 2013    (FR) ..................... 13 01828

(51) Int. Cl.
*H05K 1/18*     (2006.01)
*H01R 13/514*   (2006.01)

(52) U.S. Cl.
CPC ............. *H05K 1/18* (2013.01); *H01R 13/514* (2013.01)

(58) Field of Classification Search
None
See application file for complete search history.

(56) References Cited

U.S. PATENT DOCUMENTS 2,928,066 A * 3/1960 Gordon ............... H01R 9/2408
                                                439/717
3,848,951 A * 11/1974 Michaels ............ H01R 13/514
                                                439/357

(Continued)

FOREIGN PATENT DOCUMENTS

DE    102012104138 B3    2/2013
EP         0269505 A1    6/1988
EP         2184813 A1    5/2010

*Primary Examiner* — Chau N Nguyen
*Assistant Examiner* — Muhammed Azam
(74) *Attorney, Agent, or Firm* — Leydig, Voit & Mayer, Ltd.

(57) ABSTRACT

An electrical connecting device includes: a first connection element; a second connection element; and a body element. The first connection element is connected with a support element and the second connection element. The body element has a main extension plane, the main extension plane of the body element being positioned between the first connection element and the second connection element. The first connection element and/or the second connection element extend in a direction substantially orthogonal to the main extension plane of the body element. The body element includes a first mechanical fastening element and a second mechanical fastening element.

17 Claims, 2 Drawing Sheets

(56) References Cited

U.S. PATENT DOCUMENTS

| | | | | |
|---|---|---|---|---|
| 4,060,295 | A * | 11/1977 | Tomkiewicz | H01R 12/88 439/326 |
| 4,067,637 | A * | 1/1978 | Narozny | H01R 13/514 439/590 |
| 5,022,862 | A * | 6/1991 | Martin | H01R 9/091 29/842 |
| 5,281,163 | A * | 1/1994 | Knox | H01R 4/2433 439/404 |
| 5,655,914 | A * | 8/1997 | McCartin | H01R 12/57 439/374 |
| 5,658,158 | A * | 8/1997 | Milan | H01R 13/514 439/214 |
| 6,080,011 | A * | 6/2000 | Tsao | H01R 13/514 439/540.1 |
| 7,874,856 | B1 * | 1/2011 | Schriefer | H01R 13/514 439/214 |
| 2001/0004567 | A1 * | 6/2001 | Chen | H01R 13/514 439/607.01 |
| 2001/0044240 | A1 * | 11/2001 | Sato | H01R 13/514 439/701 |
| 2002/0072256 | A1 * | 6/2002 | Lostoski | H01R 9/26 439/76.1 |
| 2002/0072276 | A1 * | 6/2002 | Lewis | H01R 13/514 439/701 |
| 2002/0182941 | A1 * | 12/2002 | Okabe | H01R 13/6215 439/701 |
| 2003/0060065 | A1 * | 3/2003 | Harper, Jr. | H01R 13/514 439/83 |
| 2003/0148657 | A1 * | 8/2003 | Lias | H01R 31/08 439/507 |
| 2003/0194914 | A1 * | 10/2003 | Duck | G02B 6/381 439/701 |
| 2003/0199194 | A1 * | 10/2003 | Li | H01R 23/6873 439/541.5 |
| 2004/0072472 | A1 * | 4/2004 | Barry | H01R 12/716 439/638 |
| 2004/0235345 | A1 * | 11/2004 | Zheng | H01R 13/514 439/540.1 |
| 2004/0259413 | A1 * | 12/2004 | Chou | H01R 13/514 439/541.5 |
| 2006/0228948 | A1 * | 10/2006 | Swain | G06F 1/20 439/660 |
| 2007/0015383 | A1 * | 1/2007 | Jahn | H01R 13/514 439/76.2 |
| 2007/0161282 | A1 * | 7/2007 | Arellano | H01R 4/2408 439/416 |
| 2007/0178756 | A1 * | 8/2007 | Schriefer | H01R 25/003 439/535 |
| 2008/0305693 | A1 * | 12/2008 | Mei | H01R 13/514 439/701 |
| 2009/0001541 | A1 * | 1/2009 | Covert | H01L 25/105 257/686 |
| 2009/0098766 | A1 * | 4/2009 | Steinke | H01R 13/514 439/541.5 |
| 2009/0120678 | A1 * | 5/2009 | Spory | H05K 3/326 174/262 |
| 2009/0176412 | A1 * | 7/2009 | Pavlovic | H01R 13/514 439/638 |
| 2010/0144172 | A1 * | 6/2010 | Pavlovic | H01R 13/514 439/78 |
| 2010/0144176 | A1 * | 6/2010 | Fedder | H01R 13/514 439/108 |
| 2010/0240256 | A1 * | 9/2010 | Bailey | H01R 13/514 439/625 |
| 2010/0297887 | A1 * | 11/2010 | Chen | H01R 13/514 439/660 |
| 2011/0104955 | A1 * | 5/2011 | Seeley | A61N 1/3752 439/668 |
| 2011/0180296 | A1 * | 7/2011 | Hellwig | H01R 13/465 174/59 |
| 2013/0203296 | A1 * | 8/2013 | Ngo | H01R 24/00 439/638 |
| 2014/0038466 | A1 * | 2/2014 | Karodi | H01R 13/514 439/626 |

* cited by examiner

ELECTRICAL CONNECTING DEVICE

CROSS-REFERENCE TO RELATED APPLICATIONS

This application is a U.S. National Phase application under 35 U.S.C. §371 of International Application No. PCT/EP2014/066310, filed on Jul. 29, 2014, and claims benefit to French Patent Application No. FR 13/01828, filed on Jul. 30, 2013. The International Application was published in French on Feb. 5, 2015 as WO 2015/014856 A1 under PCT Article 21(2).

FIELD

The present invention relates to an electrical connecting device, in particular a connecting strip, and in particular for an electronic circuit of an automobile.

BACKGROUND

In practice it is typical to provide printed circuit boards (PCB) which have connection elements, in particular connecting strips or other elements welded to the printed circuit boards, in particular to allow the electrical connection with other electrical elements, in particular other printed circuit boards or cables.

There exists a large number of different types of such connecting strips for use in various situations. The large number of different types of such connecting strips necessitates a considerable cost.

SUMMARY

In an embodiment, the invention provides an electrical connecting device. The electrical connecting device includes: a first connection element; a second connection element; and a body element. The first connection element is connected with a support element and the second connection element. The body element has a main extension plane, the main extension plane of the body element being positioned between the first connection element and the second connection element. The first connection element and/or the second connection element extend in a direction substantially orthogonal to the main extension plane of the body element. The body element includes a first mechanical fastening element and a second mechanical fastening element, wherein: the first mechanical fastening element is configured to cooperate with another second mechanical fastening element of another electrical connecting device for mechanical fastening between the electrical connecting device and the other electrical connecting device; and/or the second mechanical fastening element is configured to cooperate with another first mechanical fastening element of another electrical connecting device for mechanical fastening between the electrical connecting device and the other electrical connecting device.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

Figure 1:
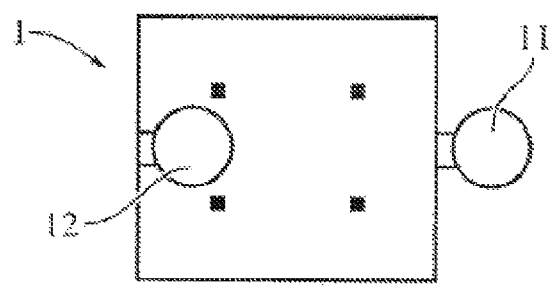
FIG. 1 is a schematic top view of an electrical connecting device in accordance with the present invention.

In an embodiment, the invention provides an electrical connecting device, in particular a connecting strip, and in particular for an automobile, so as to reduce the associated costs as far as possible and to increase the flexibility as much as possible.

In an embodiment, the invention provides an electrical connecting device, in particular a connecting strip, to produce a means for connecting a support element, the electrical connecting device comprising a first connection element and a second connection element, the first connection element being connected with the support element and the second connection element forming the means for connecting the support element, the electrical connecting device also comprising a body element, the body element having a main extension plane, the main extension plane of the body element being positioned between the first connection element and the second connection element, the first connection element and/or the second connection element extending in a direction substantially orthogonal to the main extension plane of the body element, the body element comprising a first mechanical fastening element and a second mechanical fastening element that are provided such that the first mechanical fastening element can cooperate with another second mechanical fastening element of another electrical connecting device for mechanical fastening between the electrical connecting device and the other electrical connecting device, and/or the second mechanical fastening element can cooperate with another first mechanical fastening element of another electrical connecting device for mechanical fastening between the electrical connecting device and the other electrical connecting device.

By way of such an embodiment of the connecting device, an excellent electrical and mechanical contact can be achieved between the support element and the second connection element of the electrical connecting device, as can a high degree of flexibility for the design of the connecting strip, i.e., for example, the number of connection elements.

In a preferred embodiment:

the first mechanical fastening element is provided by forming a protrusion of the body element of the electrical connecting device and the first mechanical fastening element is designed to be substantially round;
and/or
the second mechanical fastening element is provided by forming a recess of the body element of the electrical connecting device and the second mechanical fastening element is designed to be substantially round.

In accordance with another preferred embodiment of the device in accordance with the present invention, the first mechanical fastening element is provided by forming a protrusion of the body element of the electrical connecting device and the first mechanical fastening element is designed to be substantially triangular or substantially rectangular or substantially square or substantially hexagonal.

In accordance with another preferred embodiment of the device in accordance with the present invention, the second mechanical fastening element is provided by forming a recess of the body element of the electrical connecting device and the second mechanical fastening element is designed to be substantially triangular or substantially rectangular or substantially square or substantially hexagonal.

In accordance with another preferred embodiment of the device in accordance with the present invention:
the first mechanical fastening element is formed to be conical or to decrease the cross-section in parallel with the main extension plane of the body element;
and/or
the second mechanical fastening element is formed to be conical or to decrease the cross-section in parallel with the main extension plane of the body element.

In another preferred embodiment, the central axis, which is conical or decreases in shape, of the first mechanical fastening element is oriented substantially orthogonal to the main extension plane of the body element of the electrical connecting device, and/or the central axis, which is conical or decreases in shape, of the second mechanical fastening element is oriented substantially orthogonal to the main extension plane of the body element of the electrical connecting device.

In accordance with still another preferred embodiment of the device in accordance with the present invention, the conical or decreasing shape of the first mechanical fastening element and/or of the second mechanical fastening element is provided such that the large diameter of the conical or decreasing shape is located on the side of the second connection element of the electrical connecting device.

In accordance with another preferred embodiment of the device in accordance with the present invention, the first and second mechanical fastening elements are provided to allow a succession of several electrical connecting devices in a first direction of the main extension plane of the body element of the electrical connecting device.

In another preferred embodiment, the body element comprises a third mechanical fastening element and a fourth mechanical fastening element that are provided such that
the third mechanical fastening element can cooperate with another fourth mechanical fastening element of another electrical connecting device for mechanical fastening between the electrical connecting device and the other electrical connecting device, and/or
the fourth mechanical fastening element can cooperate with another third mechanical fastening element of another electrical connecting device for mechanical fastening between the electrical connecting device and the other electrical connecting device.

In accordance with still another preferred embodiment of the device in accordance with the present invention, the third mechanical fastening element is provided by forming a protrusion of the body element of the electrical connecting device and the third mechanical fastening element is designed to be substantially round.

In accordance with still another preferred embodiment of the device in accordance with the present invention, the third mechanical fastening element is provided by forming a protrusion of the body element of the electrical connecting device and the third mechanical fastening element is designed to be substantially triangular or substantially rectangular or substantially square or substantially hexagonal.

In accordance with another preferred embodiment of the device in accordance with the present invention, the fourth mechanical fastening element is provided by forming a recess of the body element of the electrical connecting device and the fourth mechanical fastening element is designed to be substantially round.

In accordance with still another preferred embodiment of the device in accordance with the present invention, the fourth mechanical fastening element is provided by forming a recess of the body element of the electrical connecting device and the fourth mechanical fastening element is designed to be substantially triangular or substantially rectangular or substantially square or substantially hexagonal.

In another preferred embodiment, the third and fourth mechanical fastening elements are provided to allow a succession of several electrical connecting devices in a second direction of the main extension plane of the body element of the electrical connecting device, the second direction being different from the first direction of the main extension plane of the body element of the electrical connecting device.

In accordance with still another preferred embodiment of the device in accordance with the present invention, the electrical connecting device comprises an element for attaching to the support element.

Other features and advantages of the invention will be apparent upon reading the following description of a particular, non-limiting exemplary embodiment of the present invention.

Figure 2:
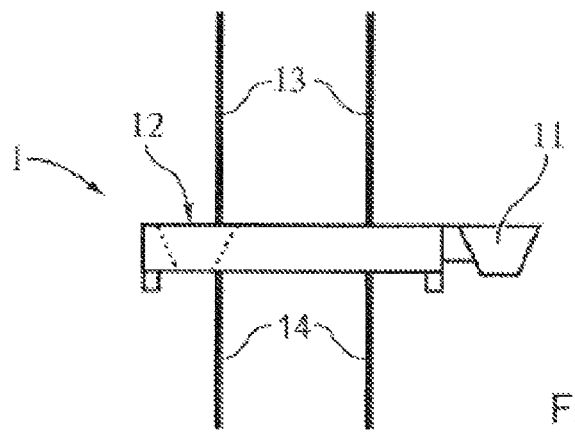
FIG. 2 is a schematic side view of an electrical connecting device in accordance with the present invention.

FIG. 1 and FIG. 2 of the accompanying drawings show an example of an electrical connecting device 1, FIG. 1 being a top view and FIG. 2 being a side view. The electrical connecting device 1 comprises a first connection element 14 and a second connection element 13. The electrical connecting device 1 comprises a body element between the first connection element 14 and the second connection element 13. The body element extends in a main extension plane. In FIG. 2, the second connection element 13 is shown from the body element to the top of the figure and the first connection element 14 is shown from the body element to the bottom of the figure. The main extension plane of the body element corresponds to the plane of the drawing in FIG. 1. The first and second connection elements are oriented substantially orthogonal to the main extension plane of the body element.

It can be seen from FIG. 1 that the first connection element comprises four electrical connecting wires. The second connection element likewise comprises four electrical connecting wires. The first and/or second connection element(s) can also comprise fewer electrical connecting wires, e.g. only one electrical connecting wire or two electrical connecting wires or three electrical connecting wires.

Figure 3:
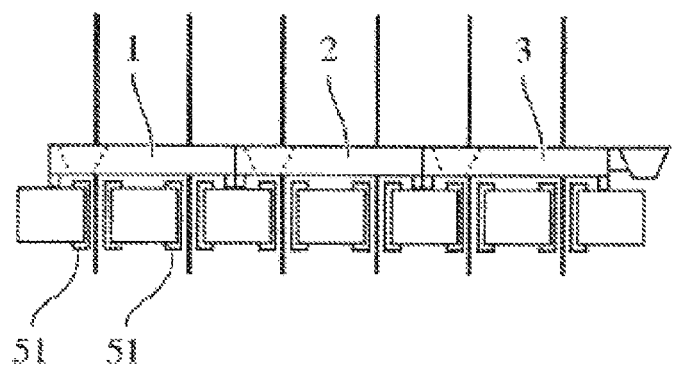
FIG. 3 is a schematic side view of three electrical connecting devices, the three electrical connecting devices being attached to each other and to a support element.

The electrical connecting device 1 is provided to be assembled to become, in particular, a connecting strip to produce a means for connecting a support element 5 (shown in FIG. 3). The first connection element is connected to the support element 5, in particular by a welding or soldering process, such as for example a reflow soldering process, for example the "pin in paste" (PIP) process or the "pin through paste" (PTP) process. The second connection element 13 (exiting the electrical connecting device 1 on the side opposite to the first connection element) thus becomes (or produces) the means for connecting the support element 5.

In accordance with the present invention, the body element comprises a first mechanical fastening element 11 (hereinafter also referred to as "male element") and a second mechanical fastening element 12 (hereinafter also referred to as "female element"). The first mechanical fastening element 11 and the second mechanical fastening element 12 are provided such that the first mechanical fastening element 11 can cooperate with another second mechanical fastening element of another electrical connecting device for mechanical fastening between the electrical connecting device 1 and another of the electrical connecting devices 2, 3, and/or the second mechanical fastening element 12 can cooperate with another first mechanical fastening element of another electrical connecting device for mechanical fastening between the electrical connecting device 1 and another of the electrical connecting devices 2, 3.

Figure 4:
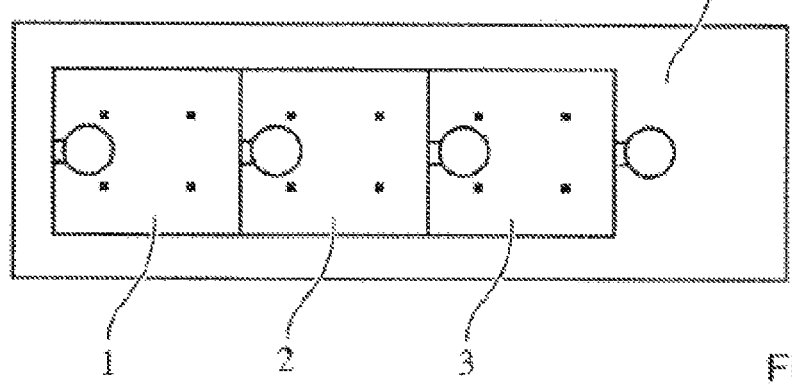
FIG. 4 is a schematic top view of the three electrical connecting devices according to FIG. 3, attached to each other and to a support element.

This is shown in FIGS. 3 and 4 which show, respectively, side and top views of an assembly of three electrical connecting devices in accordance with the present invention, the electrical connecting devices being designated by the reference signs 1, 2 and 3. It can be seen that the male element of the first electrical connecting device 1 is inserted into the female element of the second electrical connecting device 2 and that the male element of the second electrical connecting device 2 is inserted into the female element of the third electrical connecting device 3. FIG. 3 also shows contact elements 51 of the support element 5, the first connection element of each of the electrical connecting devices 1, 2, 3 being attached to the support element 5, in particular by soldering, using the contact elements.

The first and second mechanical fastening elements 11, 12 can each have, in particular, a substantially round shape, but alternatively another shape is also possible, in particular a substantially triangular shape or a substantially rectangular shape or a substantially square shape or a substantially hexagonal shape.

Provision is made in accordance with the present invention that the first and second mechanical fastening elements are provided to allow a succession of several electrical connecting devices 1, 2, 3 in a first direction of the main extension plane of the body element of the electrical connecting device 1.

Figure 5:
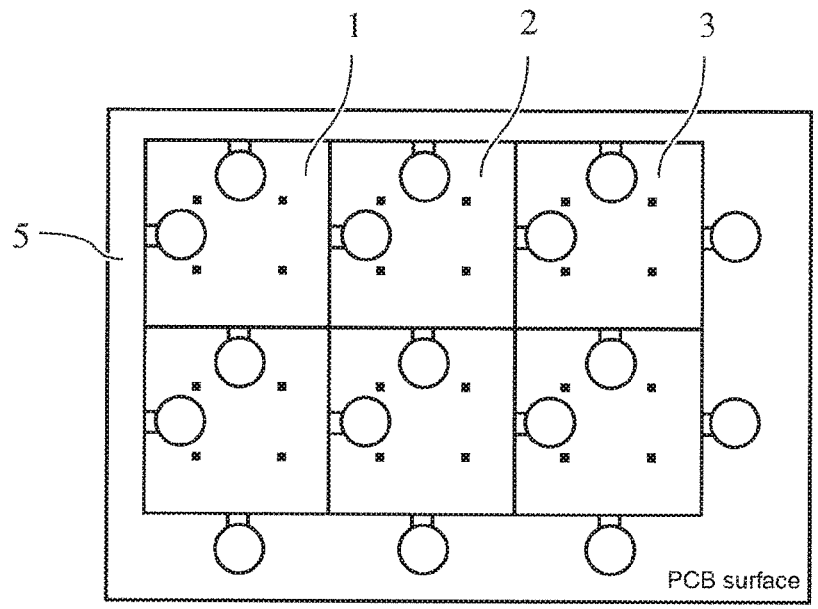
FIG. 5 is a schematic top view of six electrical connecting devices, the six electrical connecting devices being attached to each other in two different directions and to a support element.
Figure 6:
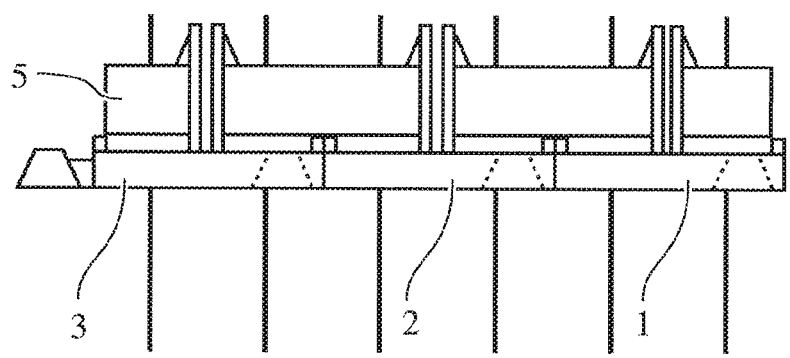
FIG. 6 is a schematic side view of several electrical connecting devices according to FIG. 5.

FIGS. 5 and 6 show, respectively, top and side views of an assembly of six electrical connecting devices 1, 2, 3 in accordance with another embodiment of the present invention. In this embodiment, the body element comprises a third mechanical fastening element (another male element) and a fourth mechanical fastening element (another female element) that are provided such that the third mechanical fastening element can cooperate with another fourth mechanical fastening element of another electrical connecting device for mechanical fastening between the electrical connecting device 1 and another of the electrical connecting devices 2, 3, and/or the fourth mechanical fastening element can cooperate with another third mechanical fastening element of another electrical connecting device for mechanical fastening between the electrical connecting device 1 and another of the electrical connecting devices 2, 3.

Provision is made in accordance with the embodiment shown in FIGS. 5 and 6 that the third and fourth mechanical fastening elements are provided to allow a succession of several electrical connecting devices in a second direction of the main extension plane of the body element of the electrical connecting device 1, the second direction being different from the first direction of the main extension plane of the body element of the electrical connecting device 1.

The third and fourth mechanical fastening elements can each have, in particular, a substantially round shape, but alternatively another shape is also possible, in particular a substantially triangular shape or a substantially rectangular shape or a substantially square shape or a substantially hexagonal shape.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE SIGNS 1, 2, 3 electrical connecting device
5 support element
11 first mechanical fastening element
12 second mechanical fastening element
13 second connection element
14 first connection element
51 contact element of the support element

The invention claimed is:

1. An electrical connecting device, comprising:
a first connection element;
a second connection element; and
a body element;
wherein the first connection element is connected with a support element and the second connection element;
wherein the body element has a main extension plane, the main extension plane of the body element being positioned between the first connection element and the second connection element;

wherein the first connection element and/or the second connection element extend in a direction substantially orthogonal to the main extension plane of the body element;

wherein the body element comprises a first mechanical fastening element and a second mechanical fastening element, wherein:
  the first mechanical fastening element is configured to cooperate with another second mechanical fastening element of another electrical connecting device for mechanical fastening between the electrical connecting device and the other electrical connecting device; and/or
  the second mechanical fastening element is configured to cooperate with another first mechanical fastening element of another electrical connecting device for mechanical fastening between the electrical connecting device and the other electrical connecting device; and wherein:
  the first mechanical fastening element is configured to be conical or to decrease the cross-section in parallel with the main extension plane of the body element; and/or
  the second mechanical fastening element is configured to be conical or to decrease the cross-section in parallel with the main extension plane of the body element.

2. The electrical connecting device according to claim 1, wherein the first mechanical fastening element is configured as a protrusion of the body element of the electrical connecting device; and
  wherein the first mechanical fastening element is substantially round.

3. The electrical connecting device according to claim 1, wherein the first mechanical fastening element is configured as a protrusion of the body element of the electrical connecting device; and
  wherein the first mechanical fastening element is substantially triangular or substantially rectangular or substantially square or substantially hexagonal.

4. The electrical connecting device according to claim 1, wherein the second mechanical fastening element is configured as the body element of the electrical connecting device; and
  wherein the second mechanical fastening element is substantially round.

5. The electrical connecting device according to claim 3, wherein the second mechanical fastening element is configured as a recess of the body element of the electrical connecting device; and
  wherein the second mechanical fastening element is substantially triangular or substantially rectangular or substantially square or substantially hexagonal.

6. An electrical connecting device, comprising:
  a first connection element;
  a second connection element; and
  a body element;
  wherein the first connection element is connected with a support element and the second connection element;
  wherein the body element has a main extension plane, the main extension plane of the body element being positioned between the first connection element and the second connection element;
  wherein the first connection element and/or the second connection element extend in a direction substantially orthogonal to the main extension plane of the body element;
  wherein the body element comprises a first mechanical fastening element and a second mechanical fastening element, wherein:
    the first mechanical fastening element is configured to cooperate with another second mechanical fastening element of another electrical connecting device for mechanical fastening between the electrical connecting device and the other electrical connecting device; and/or
    the second mechanical fastening element is configured to cooperate with another first mechanical fastening element of another electrical connecting device for mechanical fastening between the electrical connecting device and the other electrical connecting device; and
  wherein:
    the central axis, which is conical or decreases in shape, of the first mechanical fastening element is oriented substantially orthogonal to the main extension plane of the body element of the electrical connecting device; and/or
    the central axis, which is conical or decreases in shape, of the second mechanical fastening element is oriented substantially orthogonal to the main extension plane of the body element of the electrical connecting device.

7. The electrical connecting device according to claim 1, wherein:
  the central axis, which is conical or decreases in shape, of the first mechanical fastening element is oriented substantially orthogonal to the main extension plane of the body element of the electrical connecting device; and/or
  the central axis, which is conical or decreases in shape, of the second mechanical fastening element is oriented substantially orthogonal to the main extension plane of the body element of the electrical connecting device.

8. The electrical connecting device according to claim 7, wherein the conical or decreasing shape of the first mechanical fastening element and/or of the second mechanical fastening element is configured such that the large diameter of the conical or decreasing shape is located on the side of the second connection element of the electrical connecting device.

9. The electrical connecting device according to claim 1, wherein the first and second mechanical fastening elements are configured to allow a succession of several electrical connecting devices in a first direction of the main extension plane of the body element of the electrical connecting device.

10. The electrical connecting device according to claim 1, wherein the body element comprises a third mechanical fastening element and a fourth mechanical fastening element;
  wherein the third mechanical fastening element is configured to cooperate with another fourth mechanical fastening element of another electrical connecting device for mechanical fastening between the electrical connecting device and the other electrical connecting device; and/or
  wherein the fourth mechanical fastening element is configured to cooperate with another third mechanical fastening element of another electrical connecting device for mechanical fastening between the electrical connecting device and the other electrical connecting device.

11. The electrical connecting device according to claim 10, wherein the third mechanical fastening element is configured as a protrusion of the body element of the electrical connecting device; and wherein the third mechanical fastening element is substantially round.

12. The electrical connecting device according to claim 10, wherein the third mechanical fastening element is configured as a protrusion of the body element of the electrical connecting device; and wherein the third mechanical fastening element is substantially triangular or substantially rectangular or substantially square or substantially hexagonal.

13. The electrical connecting device according to claim 10, wherein the fourth mechanical fastening element is configured as a recess of the body element of the electrical connecting device; and wherein the fourth mechanical fastening element is substantially round.

14. The electrical connecting device according to claim 10, wherein the fourth mechanical fastening element is configured as a recess of the body element of the electrical connecting device; and wherein the fourth mechanical fastening element is substantially triangular or substantially rectangular or substantially square or substantially hexagonal.

15. The electrical connecting device according to claim 10, wherein the third and fourth mechanical fastening elements are configured to allow a succession of several electrical connecting devices in a second direction of the main extension plane of the body element of the electrical connecting device, the second direction being different from a first direction of the main extension plane of the body element of the electrical connecting device.

16. The electrical connecting device according to claim 1, wherein the electrical connecting device comprises an element for attaching to the support element.

17. The electrical connecting device according to claim 6, wherein the conical or decreasing shape of the first mechanical fastening element and/or of the second mechanical fastening element is configured such that the large diameter of the conical or decreasing shape is located on the side of the second connection element of the electrical connecting device.

* * * * *